(12) United States Patent
Chan et al.

(10) Patent No.: US 7,149,845 B2
(45) Date of Patent: Dec. 12, 2006

(54) CURRENT MODE LOGIC SCHEME AND CIRCUIT FOR MATCHLINE SENSE AMPLIFIER DESIGN USING CONSTANT CURRENT BIAS CASCODE CURRENT MIRRORS

(75) Inventors: Kit Fai Chan, San Jose, CA (US); Brent Haukness, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 418 days.

(21) Appl. No.: 10/733,474

(22) Filed: Dec. 12, 2003

(65) Prior Publication Data

US 2005/0132119 A1  Jun. 16, 2005

(51) Int. Cl.
*G06F 12/00* (2006.01)
*G11C 15/00* (2006.01)

(52) U.S. Cl. .......................................... 711/108; 365/49
(58) Field of Classification Search ................. 711/108; 365/49
See application file for complete search history.

(56) References Cited

U.S. PATENT DOCUMENTS

| 5,253,197 | A | * | 10/1993 | Suzuki et al. .................. 365/49 |
| 5,267,213 | A | * | 11/1993 | Sung et al. .................. 365/226 |
| 6,381,163 | B1 | * | 4/2002 | Kurihara et al. ............... 365/49 |
| 6,442,054 | B1 | * | 8/2002 | Evans et al. .................. 365/49 |
| 6,873,531 | B1 | * | 3/2005 | Ahmed et al. ................. 365/49 |

* cited by examiner

*Primary Examiner*—Matthew Kim
*Assistant Examiner*—Shane M. Thomas
(74) *Attorney, Agent, or Firm*—Dickstein Shapiro LLP

(57) ABSTRACT

A CAM device features matchlines which are coupled in series between a top current source, a bottom current source, and ground. The top current source is configured to supply a first current to the matchline and the bottom current source, while the bottom current source is configured to supply a second current to ground. The magnitude of the first current is limited by the operation of the CAM cells coupled to the matchline, and is duplicated by a current mirror architecture. The mirrored of the first current, known as the sense current, is coupled to a measurement circuit to measure the state of the matchline. This architecture features lower power consumption and faster matchline evaluations.

25 Claims, 6 Drawing Sheets

CURRENT MODE LOGIC SCHEME AND CIRCUIT FOR MATCHLINE SENSE AMPLIFIER DESIGN USING CONSTANT CURRENT BIAS CASCODE CURRENT MIRRORS

FIELD OF INVENTION

The present invention relates generally to semiconductor memory devices and, more particularly to power reduction and matchline switching noise suppression in content addressable memory (CAM) devices.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM). For example, data is stored in a RAM in a particular location, called an address. During a memory access, the user supplies an address and writes into or reads the data at the specified address.

In a CAM, however, data is stored in locations in a somewhat random fashion. The locations can be selected by an address bus, or the data can be written into the first empty memory location. Every memory location includes one or more status bits which maintain state information regarding the memory location. For example, each memory location may include a valid bit whose state indicate whether the memory location stores valid information, or whether the memory location does not contain valid information (and is therefore available for writing).

Once information is stored in a memory location, it is found by comparing every bit in a memory location with corresponding bits in a comparand register. When the content stored in the CAM memory location does not match the data in the comparand register, a local match detection circuit returns a no match indication. When the content stored in the CAM memory location matches the data in the comparand register, the local match detection circuit returns a match indication. If one or more local match detect circuits return a match indication, the CAM device returns a "match" indication. Otherwise, the CAM device returns a "no-match" indication. In addition, the CAM may return the identification of the address location in which desired data is stored or identification of one of such addresses if more than one address contained matching data. Thus, with a CAM, the user supplies the data and gets back an address if there is a match found in memory.

FIG. 1 is a circuit diagram showing a conventional DRAM-based CAM cell 100, which includes two one-transistor (1T) DRAM cells 110a and 110b, and a four-transistor comparator circuit 120 made up of transistors Q2 through Q5. Although FIG. 1 illustrates a DRAM-based CAM cell, it should be recognized that CAM devices can also be made using SRAM-based CAM cells. DRAM cells 110a and 110b are used to store values. Generally, the content of cell 110a is the logical NOT of the content of cell 110b. However, the cells 110a, 110b may also store the same values, i.e., "0"/"0", or "1"/"1", so that the CAM cell is respectively set to "always match" or "always mismatch" states. DRAM cell 110a includes transistor Q1 and a capacitor CA, which combine to form a storage node A that receives a data value from bitline BL1 at node U during write operations, and applies the stored data value to the gate terminal of transistor Q2 of comparator circuit 120. Transistor Q2 is connected in series with transistor Q3, which is controlled by a data signal transmitted on data line D1#, between a matchline M and ground potential. It should be noted that in some embodiments transistors Q2 and Q4 are coupled to a discharge line instead of being directly coupled to ground. The second DRAM cell 110b includes transistor Q6 and a capacitor CB, which combine to form a storage node B that receives a data value from bitline BL2 at node V, and applies the stored data value to the gate terminal of transistor Q4 of comparator circuit 120. Transistor Q4 is connected in series with transistor Q5, which is controlled by a data signal transmitted on inverted data line D1, between the matchline and the ground potential.

FIG. 2 is a block diagram of a portion of a CAM device 200 which includes a plurality of CAM cells, such as the CAM cell 100 of FIG. 1. For purposes of simplicity, only a portion of the CAM device 200 is illustrated. In particular, some well known components, such as the previously discussed comparand register, control logic, and I/O logic are not illustrated. The device 200 includes two arrays 210a, 210b of CAM cells 100. Each array 210a, 210b includes its own bitlines (e.g., BL11–BL16 for array 210a, and BL21–BL26 for array 210b), wordlines (e.g., WL11–WL12 for array 210a), and matchlines (e.g., M11–M12 for array 210a). Each wordline WL11–WL12, WL21–WL22 is coupled to a respective wordline driver 220a, 220b. Similarly, each bitline is also coupled to respective bitline drivers (not illustrated). Each matchline is coupled to each row of CAM cell 100 in the same wordline. The CAM device 200 also includes a plurality of bitline sense amplifiers 230. Each bitline sense amplifier 230 is coupled to the CAM cells 100 from two different arrays by two separate bitlines (e.g. bitlines BL11, BL21).

Now referring back to FIG. 1, in order perform a write operation upon a CAM cell, the data values (which are complements) to be stored are respectively written to dynamic storage nodes A and B by applying appropriate voltage signals (e.g., Vcc for logical '1' or ground for logical '0') on bitlines BL11 and BL12, and then applying a voltage signal on wordline WL. The voltage on wordline WL turn on transistor Q1 and Q6, thereby passing the voltage signals to dynamic storage nodes A and B. Refresh circuitry (not illustrated), periodically refreshes the charges stored in capacitors CA and CB, so the data does not decay over time.

In order to perform a read operation, data stored as a charge level in the capacitors CA, CB of one of the dynamic storage nodes A, B of the CAM cell 100 is sensed using an associated sense amplifier 230 (FIG. 2) which compares the voltage level of a bitline coupled to one of the dynamic storage nodes (known as the active bitline) with the voltage level of a bitline not coupled to any dynamic storage nodes (known as the reference bitline). For example, node A of the CAM cell 100 which appears as the top left CAM cell illustrated in FIG. 2 can be sensed by first precharging two bitlines. The two bitlines to be precharged would include the bitline BL11 which will couple the CAM cell 100 to the sense amplifier 230 (i.e., the active bitline), as well as the other bitline BL21 coupled to the same sense amplifier 230 (i.e., the reference bitline). As illustrated in FIG. 2, each sense amplifier has one input coupled to a bitline of array 210a and another input coupled to a corresponding bitline of array 210b. The wordline WL12 associated with the CAM cell 100 would then be activated by an applied voltage, causing the transistor Q1 in the CAM cell 100 to conduct and thereby share the charge of capacitor CA with bitline BL1. Depending upon the charge level stored in capacitor CA, the voltage level of bitline BL11 will either remain the same or be lowered. The sense amplifier 230 is then used to detect whether there is a change in potential between BL11 and BL21. The sense amplifier outputs an indication of the state stored at storage node A as a signal indicating any potential difference between bitlines BL11 and BL21 on line 235.

In order to perform a match operation, the data stored at nodes A and B are respectively applied to the gate terminals of transistors Q2 and Q4 of comparator circuit 120. Comparator circuit 120 is utilized to perform match (comparison) operations after the matchline M has been precharged by a precharge circuit (not illustrated). For example, when matchline M is precharged, an applied data value and its complement are transmitted on data lines D1 and D1# to the gate terminals of transistor Q3 and Q5, respectively. A no-match condition is detected when matchline M is discharged to ground through the signal path formed by transistors Q2 and Q3, or through the signal path formed by transistors Q5 and Q4. For example, when the stored data value at node A and the applied data value transmitted on data line D1# are both logic "1", then both transistors Q2 and Q3 are turned on to discharge matchline M to ground. When a match condition occurs, matchline M remains in its pre-charged state (i.e., no signal path is formed by transistors Q2 and Q3, or transistors Q5 and Q6).

The above described match operation is directed to what happens in a single CAM cell 100. In a real CAM device, however, the match operation is performed simultaneously on all CAM cells. In contrast, a conventional memory device, such as a DRAM, does not directly support a match function and must therefore be operated in accordance with a search algorithm to sequentially search each memory location for in order to perform the same function. Thus search operations are typically performed much faster by a CAM device. However, CAM devices consume significantly more power and produce significantly more switching noise than a conventional memory device, especially during search operations because CAM cells are accessed simultaneously. Additionally, the current flow through each matchline varies based on how well the CAM cells associated with the matchline match the search expression. This is because each CAM cell which does not match its respective search data will form a pull down path between the matchline and ground, while each CAM cell which matches it respective search data will not form a pull down path between the matchline and ground. In CAM devices each matchline is typically coupled to a large number of CAM cells. The number of pull down paths on a matchline can therefore vary greatly during a search. Thus, the rate which a matchline can be discharged will can also vary greatly.

This range in current flow in each matchline, especially when compounded by differences caused by variations in semiconductor process, power supply voltage variations, and temperature variations makes sensing the state of each matchline M a difficult procedure. Accordingly, there is a need for a CAM device architecture having a matchline sensing mechanism which is relatively immune to the number of CAM cells which match on a search operation.

SUMMARY OF THE INVENTION

Embodiments of the invention are directed to a CAM device architecture where each matchline is coupled in series between a top current source, a bottom current source, and ground. The top current source is responsive to a first bias current (Ibias1) to supply a first bias current (Ibias1) to the matchline and the bottom current source, while the bottom current source is responsive to a second bias current (Ibias2) to drain a second current equal to the second bias current from the matchline to ground. The first bias current is greater in magnitude than the second bias current (Ibias1>Ibias2). Although the top current source is configured to supply a first current equal to the first bias current, the magnitude of the first current is limited by the operation of the CAM cells coupled to the matchline as described below. If during a search operation, each of the CAM cells coupled to a mach line matches its respective search data, there would not be any pull downs through the CAM cells from the matchline to ground. Thus, for a successfull match during a search, the first current is limited to magnitude of the second current, and thus the second bias current.) However, if during a search operation at least one of the CAM cells coupled to the matchline mis-matches its respective search data, there would be a pull down through the CAM cell(s) from the matchline to ground. The top current source would then feed and force the first current to both the matchline and the lower current mirror. This higher level of current is ideally the level of the first bias current. Thus, the first current during a non-matched search operation would be equal to the first bias current (Ibias1). Ideally both the top and bottom current source are each part of a current mirror. That is, the top current source is part of a top current mirror and the bottom current source is part of a bottom current mirror. Each current mirror has two "legs." One leg is coupled in series with the matchline as described above, while another leg is instead coupled to circuitry which measures the mirrored current. The mirrored current is the current which is sensed by the measurement circuit, so it is known as the sense current (Is). Measuring the sense current (Is) produced by a current mirror architecture isolates the first current from the measurement circuit.

BRIEF DESCRIPTION OF THE DRAWINGS

The foregoing and other advantages and features of the invention will become more apparent from the detailed description of exemplary embodiments of the invention given below with reference to the accompanying drawings, in which.

DETAILED DESCRIPTION OF THE INVENTION

Figure 1:
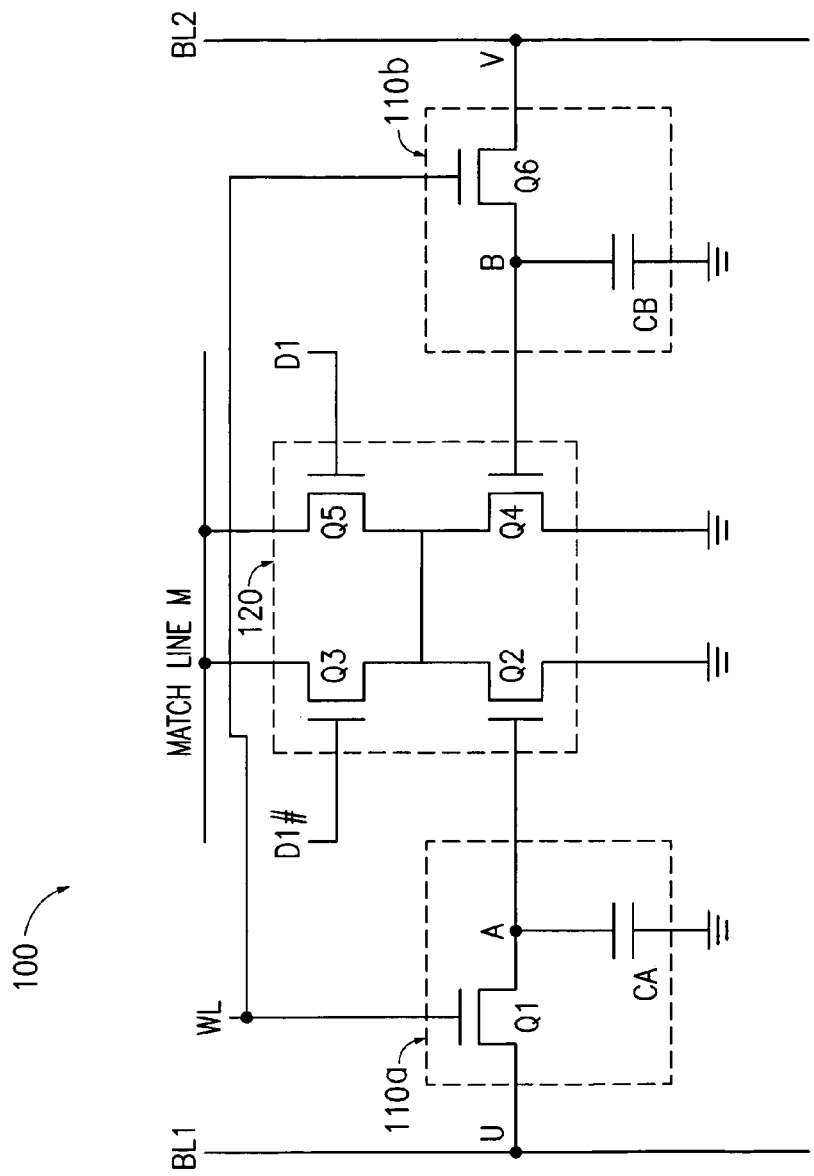
FIG. 1 is a circuit diagram of a conventional CAM cell.
Figure 2:
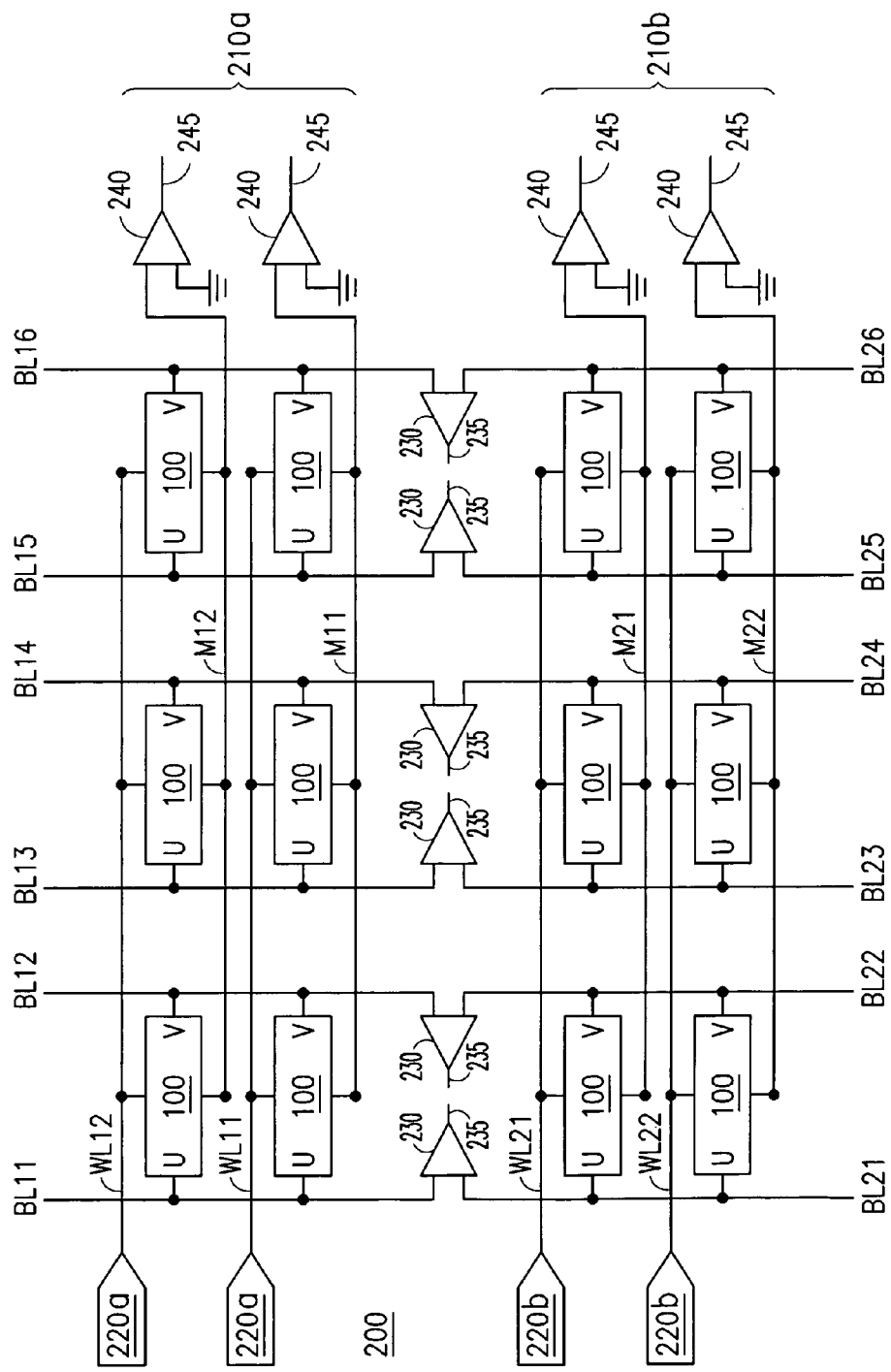
FIG. 2 is a block diagram of a conventional CAM device, illustrating how matchlines are shared across a plurality of CAM cells.
Figure 3:
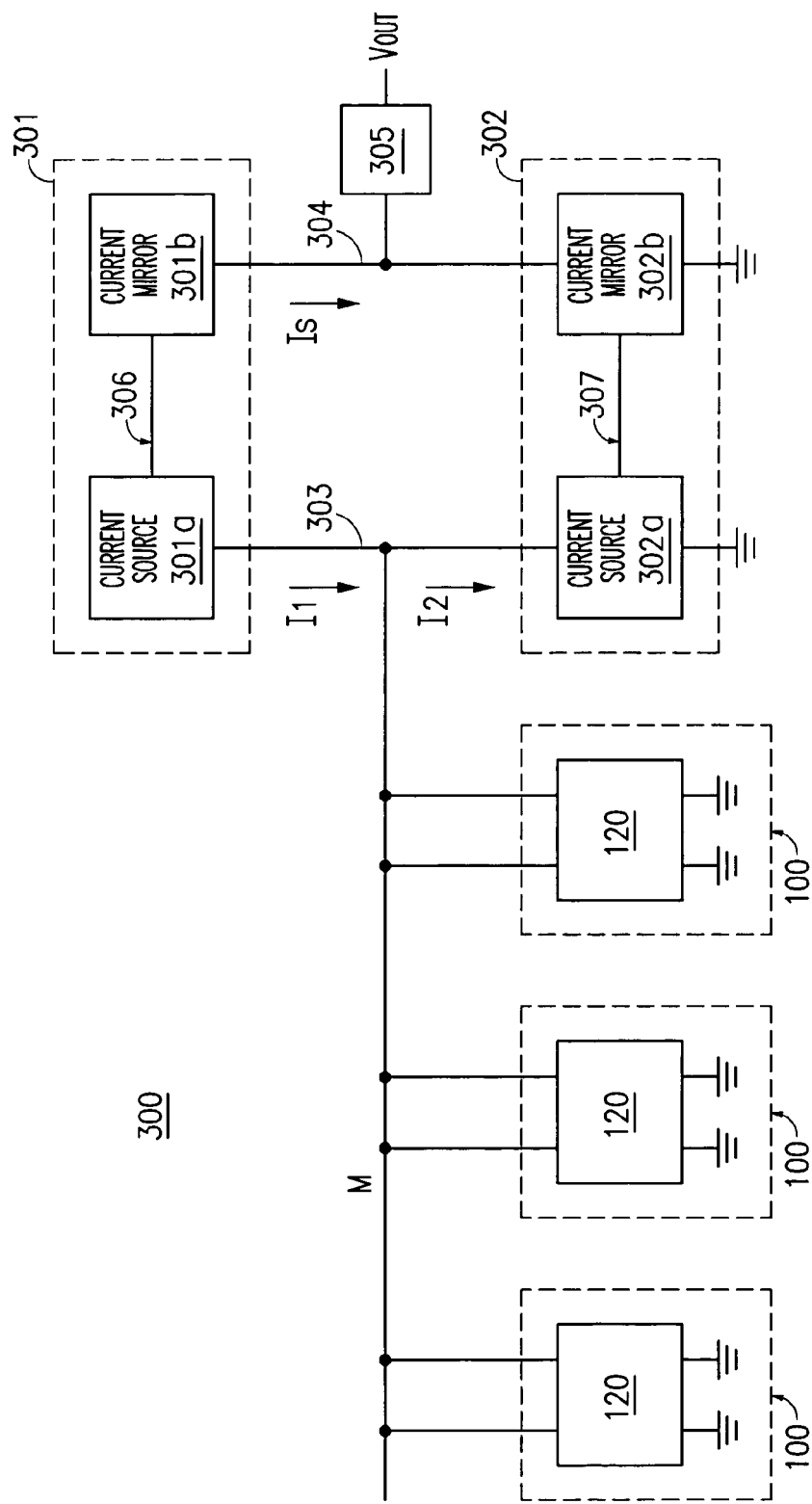
FIG. 3 is a block diagram illustrating an embodiment of the invention.

Now referring to the drawings, where like reference numerals designate like elements, there is shown in FIG. 3 a block diagram a portion of a CAM device 300 in accordance with the principles of the present invention. FIG. 3 illustrates a matchline M, which is coupled to a plurality of CAM cells 100 at their respective transistor comparator circuits 120. FIG. 3 also includes a top current source 301 and a bottom current source 302. The matchline M is coupled in series between the top current mirror 301 and the bottom current mirror 302, along line 303. An output node 305 is also coupled in series between the top and bottom current mirrors 301, 302, along line 304. The top current mirror 301 is comprised of a current source 301a which is coupled via line 306 to a current mirror 301b. The bottom current mirror 302 is also comprised of a current source 302a which is coupled via line 307 (or lines 307' and 307") to a current mirror 302b.

The top current source 301a is responsive to a first bias current (Ibias1) to supply a first current to the matchline M and the bottom current source 302a is responsive to a second bias current (Ibias2) to supply a second current equal in magnitude to the second bias current from the matchline M to ground. The top and bottom current sources 301a, 302a are configured so that the magnitude of the first bias current is greater than the magnitude of the second bias current (Ibias1>Ibias2). The top current source 301a is configured to supply a first current equal in magnitude to the first bias current (Ibias1), but the magnitude of the first current which flows from the top current source 301a is limited by the operation of the CAM cells 100 coupled to the matchline M during a search operation. If during a search operation, each of the CAM cells 100 coupled to the matchline M matches its respective search data, there would not be any pull downs through the circuits 120 of the CAM cells. Thus during a successful match, the matchline M remains isolated from ground and all of the first current output by the top current source 301a flows through the bottom current source 302a. Thus, the first current which flows from the top current source 301a during a successful match is equal to the second current, i.e., the first current is equal to the second bias current (I1=Ibias2).

If during a search operation, at least one of the CAM cells 100 coupled to the matchline M fails to match its respective search data, the circuit(s) 120 of each non-matching CAM cell 100 will pull the matchline to ground. As a result, the first current flows through both the matchline M and the bottom current source 302a. Ideally, the first bias current level (Ibias1) is chosen to be equal to this current level. Thus, the first current (I1) during a non-successful match will equal to the first bias current (i.e., I1=Ibias1).

Since the top and bottom current mirrors 301, 302 each include respective current mirrors 301b, 302b, the first current flowing out of the top current source 301a on line 303 is duplicated on line 304, as the sensing current (Is). A measuring circuit 305 is coupled to the first and second current mirror. In an exemplary embodiment, the measuring circuit 305 is a pair of inverters 305a, 305b (See FIGS. 4–5) coupled to line 304 so as to be in series with the top and bottom current mirror 301b, 302b. The function of the second inverter 305b is to achieve a desired polarity for output. Thus, the measuring circuit 305 may also be constructed using a single inverter 305a. The measuring circuit 305 outputs a voltage Vout indicative of the state of the current Is. The use of the measuring circuit 305 on the current mirror of the top and bottom current mirrors isolates the measuring circuit 305 from the matchline.

Figure 4:
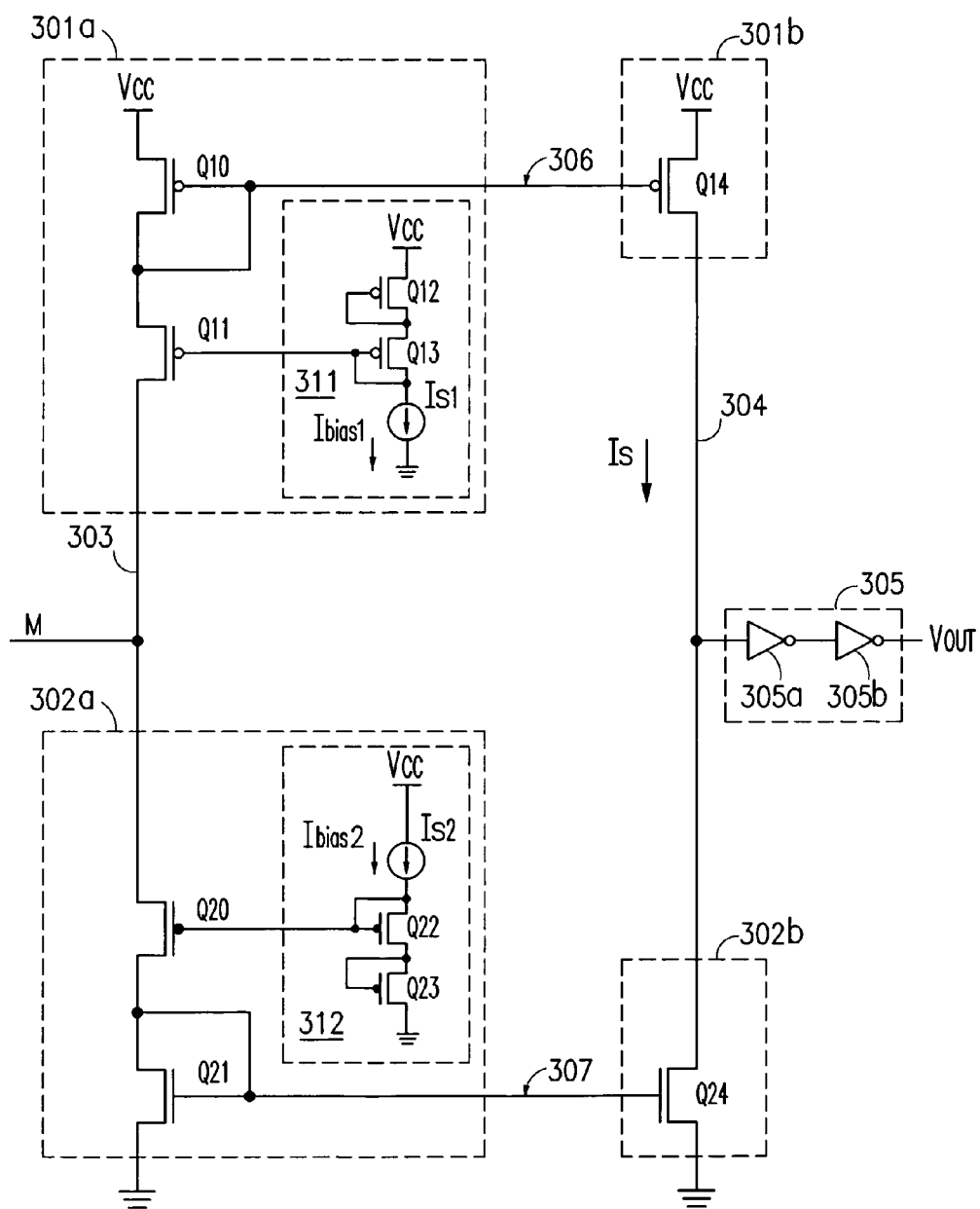
FIG. 4 is a circuit diagram of a first embodiment of the invention.
Figure 5:
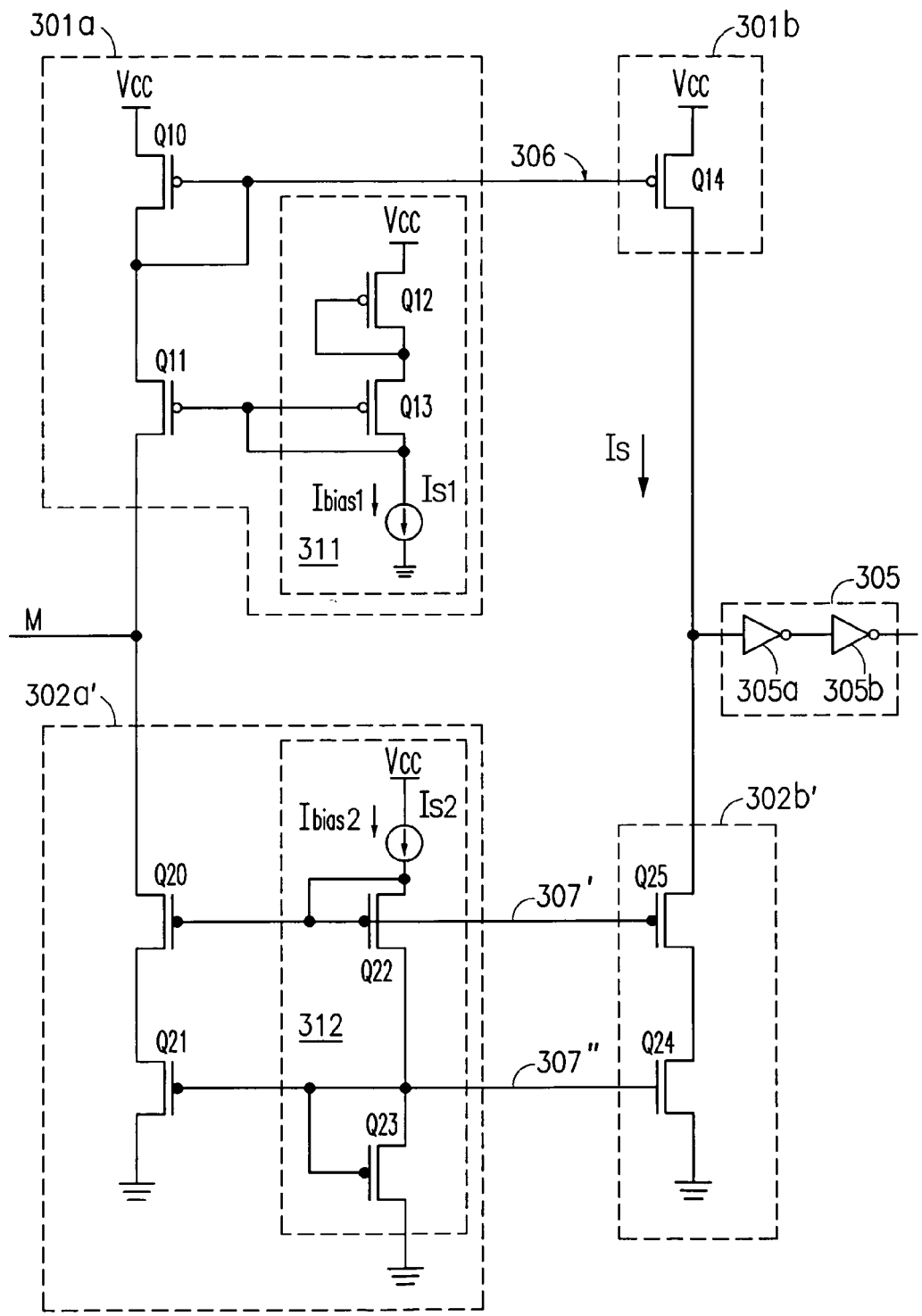
FIG. 5 is a circuit diagram of a second embodiment of the invention.

FIGS. 4 and 5 are circuit diagrams illustrating two exemplary embodiments of the top and bottom current sources 301, 302. The two embodiments differ only in their implementation of the bottom current source. Thus, the top current mirror 301, including the current source 301a and the current mirror 301b, are identical in both FIGS. 4 and 5. Additionally, the same sensing circuit 305 are used in both embodiments.

Now referring to FIG. 4, it can be seen that the first current source 301a is comprised of a transistor Q10 having a first source/drain terminal coupled to a power source having Vcc potential and a second source/drain terminal coupled to a first source/drain terminal of a transistor Q11. The second source/drain terminal of transistor Q11 is coupled the matchline M via line 303. A first bias circuit 311 includes a transistor Q12 having one source/drain coupled to a power source having Vcc potential and a second source/drain coupled to a first source/drain of a transistor Q13. The second source/drain of transistor Q13 is coupled to a current source IS1. The current source IS1 is biased to supply a first bias current Ibias1 to ground, and can be constructed using a conventional bandgap technique to supply a constant current across a range of temperatures. The gate of the Q12 transistor is coupled to the second source/drain terminal of Q12, while the gate of transistor Q13 is coupled to the gate of transistor Q11.

The top current mirror 301b includes a transistor Q14, having a first source/drain terminal coupled to a power source having Vcc potential and a gate coupled the gate of transistor Q10 from the first current source 301a via line 306. The other source/drain terminal of transistor Q14 is coupled, via line 304, to the measuring circuit 305.

The measuring circuit 305 is coupled to line 304, between the top and bottom current mirrors 301b, 302b, and includes two series connected inverters 305a, 305b. The measuring circuit 305 acts as a voltage divider, and the two inverters force the output voltage Vout to be either a logical "0" or "1."

The bottom current source 302a includes a transistor Q20 which has a first source/drain terminal coupled to the matchline via line 302, and a second source/drain terminal coupled to a first source/drain terminal of a transistor Q21. The gate terminal of transistor Q20 is coupled to a second bias circuit 312 as later described. The second source/drain terminal of transistor Q21 is coupled to ground. The first source/drain terminal of transistor Q21 is also coupled to the gate terminal of transistor Q21.

A second bias circuit 312 includes a Vcc potential coupled to a second current source IS2, which is biased to generate a second bias current Ibias2. The current source IS2 can be constructed using a conventional bandgap technique to supply a constant current across a range of temperatures. In the illustrated embodiment, the first bias current Ibias1 is greater than the second bias current Ibias2. The second current source IS2 is coupled to the first source/drain terminal and the gate terminal of transistor Q22. The gate terminal of transistor Q22 is also coupled to the gate terminal Q20 of the second current source 302a. A second source/drain terminal of transistor Q22 is coupled to the gate and first source/drain terminal Q23, while the second source/drain terminal of transistor Q23 is coupled to ground. The second current mirror 302b includes a transistor Q24 having a first source/drain terminal coupled to the measurement circuit 305 and the second source/drain terminal of transistor Q14. The second source/drain terminal of transistor Q24 is coupled to ground. The gate of transistor Q24 is coupled to the gate of transistor Q21 via line 307.

Now referring to FIG. 5, it can be seen that this second embodiment differs from the embodiment illustrated in FIG. 4 only in the lower current source 302a and current mirror 302b. More specifically, in the lower current source 302a', transistor Q21 no longer has its first source/drain terminal coupled to its gate terminal. Additionally, the lower current mirror 302b' is now coupled to the lower current source 302a via two lines 307', 307" instead of a single line 307. The first line 307' couples the gates of transistors Q20, Q22, and Q25, and is also coupled to the source/drain terminal of transistor Q22 which is coupled to the second bias current source IS2. The second line of 307" couples the gates of transistors Q21, Q23, and Q24 and is also coupled to the source/drain of Q23 which is coupled to a source/drain of transistor Q22.

In both embodiments, circuit 301a is coupled via line 306 to circuit 301b and these two circuits are configured to be in a current mirror configuration so that the current Is measured by circuit 305 is the mirrored current of the current flowing from the Vcc power source in circuit 301a to line 303 in circuit 301a. Circuit 311 is configured to bias the output current of circuit 301a to a predetermined level equal to Ibias1, which in circuit 311 is supplied by current source IS1. However, as previously discussed, the actual current output of circuit 301a is dependent upon the state of the matchline.

In the embodiment shown in FIG. 4, circuit 302a is configured to output a current equal to Ibias2 to ground, where Ibias2 is less than Ibias1. Line 307 couples circuit 302a to circuit 302b, and circuits 302a and 302b are set up in a current mirror configuration so that the same amount of current flows through both circuits 302a and 302b. Circuit 312 is configured to control the output of circuit 302a, and includes second bias current (Ibias2) current source IS2. In the embodiment shown in FIG. 5, circuits 302a' and 302b' perform the same function as circuits 302a and 302b, respectively. However, as shown in the figures, circuits 302a and 302b have been modified to use two lines 307', 307"0 instead of 307.

Thus, the embodiments show in FIGS. 4 and 5 both couple the matchline M between two current sources, each implemented within a current mirror. The current which flows out of the top current source is dependent upon the result of a search operation on the matchline, and can be sensed on current mirrors which are not coupled to the matchline. An output circuit preferably includes a pair of inverters to read the current state and output the state as a full range voltage signal.

Additionally, in the above embodiments, the matchline M will generally not be precharged to a full Vcc potential since the internal impedance of the upper current source 301a will cause a small potential drop. Thus, during evaluation the matchline M will no longer swing from Vcc to near-ground, thereby permitting a savings in power while simultaneously speeding up evaluation time. Additionally, the current in the power rails will be fix, thereby eliminating a source of switching noise.

Figure 6:
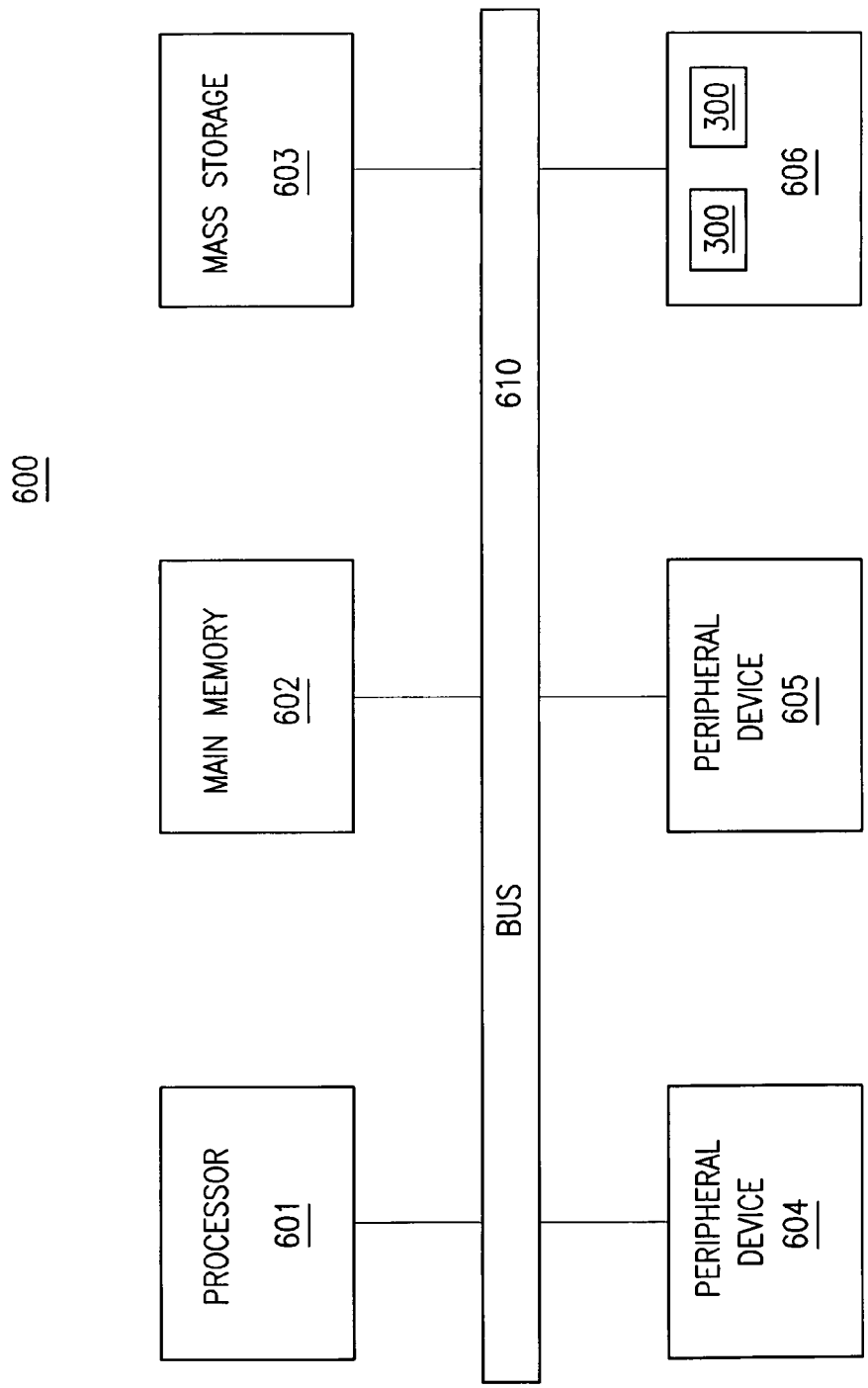
FIG. 6. is a block diagram of a processor based system having a CAM device employing in accordance with the principles of the present invention.

FIG. 6 is an illustration of an exemplary processor based system 600 including a CAM device 300 in accordance with the principles of the present invention. The system 600 includes a central processing unit (CPU) 601, a main memory 602, at least one mass storage device 603, at least peripheral devices 604–605 (e.g., keyboard and display), and a CAM subsystem 606, each coupled to a bus 610. The CAM subsystem 606 includes a plurality of CAM devices 300 of the present invention.

An example of a processor based system 600 may be a network router, in which case peripheral devices 604–605 may be network cards attached to different computer networks. The main memory 602 may include a random access memory for storing data, and a read only memory for storing a boot loader, and the mass storage device 603 may store an operating system and application software for the router. The CAM subsystem 606 may be used to store network routing table.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A content addressable memory, comprising:
   a matchline;
   a plurality of content addressable memory cells, coupled to said matchline;
   a first current source, coupled to the matchline; and
   a second current source, coupled to the matchline;
   wherein said first current source is responsive to a first bias current to supply a first current to the matchline and to the second current source, and said second current source is responsive to a second bias current to supply a second current from the matchline to ground, said first bias current being greater than said second bias current.

2. The content addressable memory of claim 1, further comprising:
   a first current mirror, coupled to said first current source;
   a second current mirror, coupled to said second current source; and
   a current measurement circuit, coupled to said first current mirror and said second current mirror;
   wherein
   said first current mirror is coupled to said first current source and configured to supply a third current mirroring said first current to said measurement circuit and said second current mirror, and
   said second current mirror is coupled to said second current source and configured to supply a fourth current mirroring said second current.

3. The content addressable memory of claim 2, wherein said current measurement circuit outputs a voltage reflecting a magnitude of a sense current flowing from said first current source.

4. The content addressable memory of claim 3, wherein said measurement circuit comprises a first inverter, coupled to said first current mirror and said second current mirror.

5. The content addressable memory of claim 4, wherein said measurement circuit further comprises:
   a second inverter, coupled in series with said first inverter.

6. The content addressable memory of claim 1, wherein said first current source comprises:
  a first transistor, coupled to a power source;
  a second transistor, coupled to said first transistor and to the matchline;
  wherein said second transistor has a gate terminal coupled to a bias circuit.

7. The content addressable memory of claim 6, wherein said bias circuit comprises:
  a third transistor, coupled to the power source;
  a fourth transistor, coupled to said third transistor, and coupled to the gate of said second transistor; and
  a first bias current source coupled said fourth transistor and to ground;
  wherein said gate of said fourth transistor is also coupled to a source/drain terminal of said fourth transistor which is coupled to a terminal of said first bias current source.

8. The content addressable memory of claim 1, wherein said second current source comprises:
  a first transistor, coupled to the matchline;
  a second transistor, coupled to said first transistor and to ground;
  wherein said first transistor has a gate terminal coupled to a bias circuit.

9. The content addressable memory of claim 8, wherein said bias circuit comprises:
  a second bias current source coupled to a power source;
  a third transistor coupled to said second bias current source and coupled to the gate of said first transistor; and
  a fourth transistor, coupled to said third transistor and to ground.

10. A processor based system, comprising:
  a processor;
  a content addressable memory, coupled to said processor, said content addressable memory comprising:
  a matchline;
  a plurality of content addressable memory cells, coupled to said matchline;
  a first current source, coupled to the matchline; and
  a second current source, coupled to the matchline;
  wherein said first current source is responsive to a first bias current to supply a first current to the matchline and to the second current source, and said second current source is responsive to a second bias current to supply a second current from the matchline to ground, said first bias current being greater than said second bias current.

11. The system of claim 10, further comprising:
  a first current mirror, coupled to said first current source;
  a second current mirror, coupled to said second current source; and
  a current measurement circuit, coupled to said first current mirror and said second current mirror.

12. The system of claim 11,
  wherein
  said first current mirror is coupled to said first current source and configured to supply a third current mirroring said first current to said measurement circuit and said second current mirror, and
  said second current mirror is coupled to said second current source and configured to supply a fourth current mirroring said second current.

13. The system of claim 11, wherein said current measurement circuit outputs a voltage reflecting a magnitude of a sense current flowing from said first current source.

14. The system of claim 13, wherein said measurement circuit comprises a first inverter, coupled to said first current mirror and said second current mirror.

15. The system of claim 14, wherein said measurement circuit further comprises:
  a second inverter, coupled in series with said first inverter.

16. The system of claim 10, wherein said first current source comprises:
  a first transistor, coupled to a power source;
  a second transistor, coupled to said first transistor and to the matchline;
  wherein said second transistor has a gate terminal coupled to a bias circuit.

17. The system of claim 13, wherein said power circuit comprises:
  a third transistor, coupled to the power source;
  a fourth transistor, coupled to said third transistor and coupled to the gate of said second transistor; and
  a first bias current source coupled said fourth transistor and to ground.

18. The system of claim 10, wherein said second current source comprises:
  a first transistor, coupled to the matchline;
  a second transistor, coupled to said first transistor and to ground;
  wherein said first transistor has a gate terminal coupled to a bias circuit.

19. The system of claim 18, wherein said bias circuit comprises:
  a bias current source coupled to a power source;
  a third transistor coupled to said second bias current source and coupled to the gate of said first transistor; and
  a fourth transistor, coupled to said third transistor and to ground.

20. The system of claim 10, further comprising:
  a plurality of network interface devices, each of said network interface devices coupled to said processor, wherein said system routes network traffic between the plurality of network interface devices.

21. A method for operating a content addressable memory, comprising:
  supplying a first current to a matchline;
  supplying a second current from said matchline to ground;
  wherein said first current is responsive to a first bias current and said second current is responsive to a second bias current, said first bias current being greater than said second bias current.

22. The method of claim 21, further comprising:
  measuring said first current to determine a state of a plurality of CAM cells coupled to said matchline.

23. The method of claim 22, wherein said measuring step comprises:
  measuring a third current flowing between a first current mirror and a measurement circuit;
  wherein a first current mirror is coupled to said first current source and configured to produce the third current, said third current having the same magnitude as said first current.

24. The method of claim 23, wherein said measuring step indicates that the matchline is in a first logical state when said third current is equal to said first bias current.

25. The method of clam 24, wherein said measuring step indicates that the matchline is in a second logical state when said third current is equal to said second bias current.

* * * * *

UNITED STATES PATENT AND TRADEMARK OFFICE
CERTIFICATE OF CORRECTION

PATENT NO. : 7,149,845 B2  Page 1 of 1
APPLICATION NO. : 10/733474
DATED : December 12, 2006
INVENTOR(S) : Kit Fai Chan et al.

It is certified that error appears in the above-identified patent and that said Letters Patent is hereby corrected as shown below:

Column 1, line 47, "indicate" should read --indicates--;

Column 3, line 62, "it" should read --its--;

Column 4, line 27, "mach line" should read --matchline--;

Column 4, line 29, "successfull" should read --successful--.

Column 4, line 31, "current.)" should read --current.--;

Column 5, line 4, "employing in" should read --employed in--;

Column 5, line 12, "diagram a" should read --diagram of a--;

Column 6, line 15, "305 are used" should read --305 is used--;

Column 6, line 22, "coupled the" should read --coupled to the--;

Column 6, line 37, "coupled the" should read --coupled to the--; and

Column 7, line 49, "show" should read --shown--.

Claim 7, column 9, line 13, "coupled said" should read --coupled to said--; and

Claim 17, column 10, line 19, "coupled said" should read --coupled to said--.

Signed and Sealed this

Third Day of April, 2007

JON W. DUDAS
*Director of the United States Patent and Trademark Office*